(12) United States Patent
Nobuoka et al.

(10) Patent No.: US 10,808,332 B2
(45) Date of Patent: Oct. 20, 2020

(54) SCALMGO4 SINGLE CRYSTAL AND DEVICE

(71) Applicant: PANASONIC CORPORATION, Osaka (JP)

(72) Inventors: Masaki Nobuoka, Nara (JP); Kentaro Miyano, Osaka (JP); Naoya Ryoki, Osaka (JP); Takehiro Asahi, Hyogo (JP); Akio Ueta, Hyogo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/433,707

(22) Filed: Jun. 6, 2019

(65) Prior Publication Data

US 2019/0376207 A1 Dec. 12, 2019

(30) Foreign Application Priority Data

Jun. 7, 2018 (JP) .................. 2018-109404

(51) Int. Cl.
*C30B 29/22* (2006.01)
*C30B 15/14* (2006.01)
*H01L 33/00* (2010.01)
*H01L 33/32* (2010.01)
*H01L 33/16* (2010.01)

(52) U.S. Cl.
CPC .............. *C30B 29/22* (2013.01); *C30B 15/14* (2013.01); *H01L 33/007* (2013.01); *H01L 33/32* (2013.01); *H01L 33/16* (2013.01)

(58) Field of Classification Search
CPC .......... C30B 15/14; C30B 15/20; C30B 29/22
See application file for complete search history.

(56) References Cited

FOREIGN PATENT DOCUMENTS

JP 2017-119597 A 7/2017
JP 2017119597 A * 7/2017 ............. C30B 29/22

* cited by examiner

*Primary Examiner* — Matthew E. Gordon
(74) *Attorney, Agent, or Firm* — McDermott Will & Emery LLP

(57) ABSTRACT

An object is to provide a high-quality $ScAlMgO_4$ single crystal and a device. The $ScAlMgO_4$ single crystal includes Sc, Al, Mg, and O, in which the atomic percentage ratio of Mg to Al, Mg/Al (atom %/atom %), as measured by an inductively coupled plasma emission spectrometric method, is more than 1 and less than 1.1.

6 Claims, 10 Drawing Sheets

SCALMGO4 SINGLE CRYSTAL AND DEVICE

CROSS REFERENCE TO RELATED APPLICATIONS

This application is entitled to and claims the benefit of Japanese Patent Application No. 2018-109404, filed on Jun. 7, 2018, the disclosure of which including the specification, drawings and abstract is incorporated herein by reference in its entirety.

TECHNICAL FIELD

The present disclosure relates to a $ScAlMgO_4$ single crystal and a device.

BACKGROUND ART

For example, a method described in Japanese Patent Application Laid-Open No. 2017-119597 (hereinafter, also referred to as "PTL1") is known as a method for producing a $ScAlMgO_4$ single crystal. The method described in PTL 1 includes setting the composition of a melt at the start of pulling to a composition not identical to the stoichiometric ratio of $ScAlMgO_4$, starting the pulling, and thereafter feeding a solution substantially satisfying the stoichiometric ratio of $ScAlMgO_4$, to a crucible, to thereby produce a $ScAlMgO_4$ single crystal.

SUMMARY OF INVENTION

Technical Problem

However, in the case where a $ScAlMgO_4$ single crystal is produced by the method described in PTL 1, the resulting single crystal is not aligned in crystal orientation. There is then required to provide a high-quality $ScAlMgO_4$ single crystal aligned in crystal orientation.

The present disclosure has been made in order to solve the above problem. More specifically, an object of the present disclosure is to provide a high-quality $ScAlMgO_4$ single crystal uniformly aligned in crystal orientation.

Solution to Problem

In order to solve the problem mentioned above, the present disclosure provides a $ScAlMgO_4$ single crystal, including Sc, Al, Mg, and O as constituent atoms, in which an atomic percentage ratio of Mg to Al in the constituent atoms, Mg/Al (atom %/atom %), as measured by an inductively coupled plasma emission spectrometric method, is more than 1 and less than 1.1.

Advantageous Effects of Invention

According to the present disclosure, there can be provided a high-quality $ScAlMgO_4$ single crystal uniformly aligned in crystal orientation.

DESCRIPTION OF EMBODIMENTS

Figure 1:
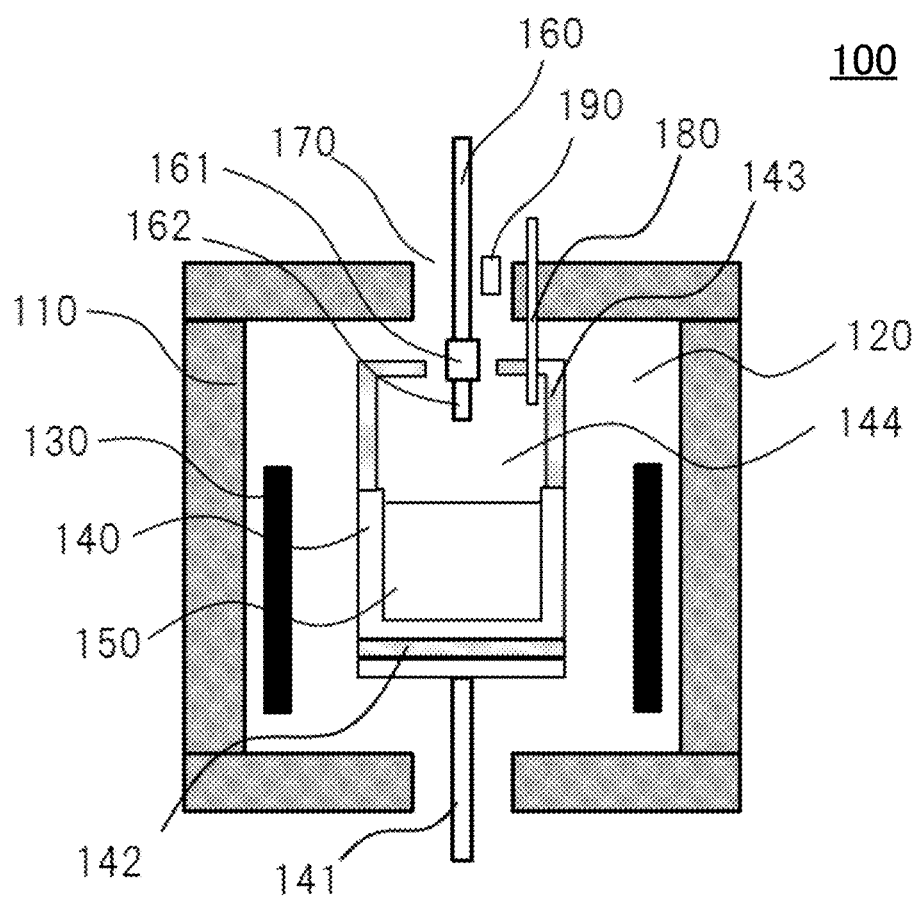
FIG. 1 illustrates a configuration of a crystal breeding apparatus for production of a $ScAlMgO_4$ single crystal according to one embodiment of the present disclosure.

Hereinafter, a $ScAlMgO_4$ single crystal according to one embodiment of the present disclosure will be described with reference to the accompanying drawings.

The conventional method described in PTL 1 has not employed any measure against evaporation of magnesium (Mg) during growth or the like of a single crystal in production of a $ScAlMgO_4$ single crystal. Thus, magnesium (Mg) contained in a melt is easily evaporated from the surface of the melt, and the amount of magnesium (Mg) to be incorporated into the crystal may easily be insufficient. In addition, the amount of magnesium (Mg) may be changed over time to result in the change in the magnesium (Mg) concentration in a Mg/Al layer as a bilayer sandwiched between scandium (Sc) layers constituting a $ScAlMgO_4$ single crystal, easily causing the crystal orientation of the $ScAlMgO_4$ single crystal to be disordered, to easily generate a $ScAlMgO_4$ single crystal not aligned in crystal orientation.

An ideal $ScAlMgO_4$ single crystal has a magnesium (Mg) atom and an aluminum (Al) atom that are the same in terms of the number thereof in a Mg/Al layer. In an actual $ScAlMgO_4$ single crystal, however, magnesium (Mg) is insufficient during formation of a Mg/Al layer, leading to incorporation of an aluminum (Al) atom into a site into which a magnesium (Mg) atom is to be incorporated. As a result, an aluminum (Al)-rich crystal is formed, thereby generating a ScAlMgO$_4$ single crystal not aligned in crystal orientation.

On the contrary, the present inventors have made intensive studies and thus have found that a magnesium (Mg)-rich ScAlMgO$_4$ single crystal is uniform in crystal orientation unlike an aluminum (Al)-rich crystal. Furthermore, the present inventors have found that an important approach for an improvement in crystal quality is to form a crystal so that the magnesium (Mg) concentration at the interface between a melt and the crystal is rich during growth of the crystal to thereby allow magnesium (Mg) to be sufficiently incorporated into a ScAlMgO$_4$ crystal.

A ScAlMgO$_4$ single crystal produced by a conventional method is not aligned in crystal orientation in crystallization of the ScAlMgO$_4$ single crystal regardless of the presence of white turbidity, and thus is higher in the full width at half maximum (sec) of an X-ray rocking curve, as an index for evaluation of the alignment of the crystal orientation. A gallium nitride crystal (GaN) obtained with such a ScAlMgO$_4$ single crystal high in full width at half maximum (sec) as a seed substrate is then increased in crystal defects as compared with such a gallium nitride crystal obtained with a ScAlMgO$_4$ single crystal low in full width at half maximum (sec) as a seed substrate.

For example, a ScAlMgO$_4$ single crystal obtained by the method described in PTL 1 exhibits a high full width at half maximum (sec) of an X-ray rocking curve as compared with an ideal crystal. While the detail will be described in Examples below, the full width at half maximum (sec) of a ScAlMgO$_4$ single crystal (Comparative Examples) produced by a conventional method is 22.7 to 46.4 seconds, and such a value exceeds an ideal full width at half maximum (sec) which is 20 seconds or less.

A gallium nitride crystal, which is formed with such a ScAlMgO$_4$ single crystal as a seed substrate, then has a dislocation density of $10^8$ (cm$^{-2}$) or more, such a value being the same as the dislocation density of a gallium nitride crystal formed on sapphire (single crystal Al$_2$O$_3$) which is a common seed substrate.

In addition, a light-emitting diode, which is formed on a gallium nitride crystal high in dislocation density, causes a current to be highly leaked from defects in the gallium nitride crystal, and thus the light-emitting diode is deteriorated in brightness. Accordingly, a challenge is to enhance the quality of a ScAlMgO$_4$ single crystal, which has a large effect on device performances.

On the contrary, in the present disclosure, the atmosphere above a melt is adjusted so that the amount of magnesium (Mg) to be incorporated into a crystal in crystallization of ScAlMgO$_4$ is increased. Thus, the atomic percentage ratio of magnesium (Mg) to aluminum (Al) constituting a single crystal, Mg/Al (atom %/atom %), is more than 1 and less than 1.1. In other words, the present disclosure can achieve a magnesium-rich ScAlMgO$_4$ crystal and thus can provide a high-quality ScAlMgO$_4$ single crystal. The atomic percentage ratio of magnesium (Mg) to aluminum (Al) constituting the single crystal is measured by an inductively coupled plasma emission spectrometric method (hereinafter, also referred to as "ICP-AES"). The Mg/Al (atom %/atom %) is more preferably 1.03 or more and 1.07 or less.

FIG. 1 is a schematic view illustrating the configuration of crystal breeding apparatus 100 for production of a ScAlMgO$_4$ single crystal according to one embodiment of the present disclosure. Crystal breeding apparatus 100 is a crystal pulling apparatus according to the Czochralski method (hereinafter, also referred to as "CZ method"), and includes heating chamber 120 formed from thermal insulator 110, heater 130 provided in heating chamber 120, and crucible 140 covered with heater 130.

Crystal breeding apparatus 100 also further includes crucible support shaft 141 that supports crucible 140, refractory 142 to be disposed between crucible 140 and crucible support shaft 141, and melt-warming heat-insulating material 143 to be disposed on the crucible 140. A space to be formed with crucible 140 and melt-warming heat-insulating material 143 is defined as Mg concentration-keeping chamber 144. Gas concentration measurement meter 180 is inserted into Mg concentration-keeping chamber 144. Gas introduction section 170 through which crystal pulling shaft 160 is to be inserted and/or through which gas is to be introduced is disposed on the upper portion of thermal insulator 110, and radiation thermometer 190 is disposed near gas introduction section 170.

In the case of production of a ScAlMgO$_4$ single crystal by crystal breeding apparatus 100, a raw material that provides the ScAlMgO$_4$ single crystal is packed in crucible 140. More specifically, melt 150 obtained by heating and melting such a raw material is packed. Seed crystal 162 held by seed holder 161 with which crystal pulling shaft 160 is provided is brought into contact with melt 150 in crucible 140, and thereafter crystal pulling shaft 160 is pulled to result in breeding of a single crystal. A load cell (not illustrated) is provided at the upper end of crystal pulling shaft 160, and can measure the weight of a crystal being pulled.

In pulling of a crystal, a desired gas is supplied from gas introduction section 170 to heating chamber 120 and Mg concentration-keeping chamber 144. In breeding of a crystal, gas concentration measurement meter 180 measures the carbon monoxide concentration and the oxygen concentration in Mg concentration-keeping chamber 144. Radiation thermometer 190 measures the temperature of the surface of melt 150. Crystal breeding apparatus 100 also includes a chamber, a vacuum pump, a gas supply source, a gas discharge port, a heater power source, and a controlling apparatus that controls the temperature and/or the flow rate of gas which are not illustrated. Hereinafter, each constituent component of crystal breeding apparatus 100 of the present embodiment will be described in detail.

In the present embodiment, crucible 140 is made of iridium. The material, however, is not limited thereto, and any of various materials can be used which have heat resistance at the melting temperature of a raw material and reaction resistance to a raw material. Examples of a preferable material also include tungsten, molybdenum, and tantalum.

Crucible support shaft 141 is made of tungsten. The material, however, is not limited thereto, and any of various materials can be used which have heat resistance to the temperature in heating chamber 120 and strength that allows crucible 140 and melt 150 to be supported. Crucible support shaft 141 has the function of being rotated and rising and falling at a predetermined rate.

Refractory 142 is made of zirconia, but the material is not limited thereto. Any material is selected for refractory 142, the material having reaction resistance to iridium as the material of crucible 140 and reaction resistance to tungsten as the material of crucible support shaft 141. Melt-warming heat-insulating material 143 is also made of zirconia, but the material is not limited thereto. Any material is selected for melt-warming heat-insulating material 143, the material having reaction resistance to the material (which is here iridium) of crucible 140.

Thermal insulator 110 is made of carbon, but the material is not limited thereto. Thermal insulator 110 is provided with gas introduction section 170 through which crystal pulling shaft 160 is to be inserted and a through-hole through which crucible support shaft 141 is to be inserted, which are disposed at the upper section and the lower section, respectively.

Heater 130 in the present embodiment is a resistance heating system, and is made of cylindrical carbon. Heater 130 generates heat by application of a current, and heater 130 heats the entire atmosphere of heating chamber 120 located in thermal insulator 110. As a result, a raw material packed in crucible 140 is heated and molten. The type and the heating system of heater 130 in the present disclosure are not limited thereto, and heaters of various systems including high-frequency induction heating and infrared concentrated heating systems can be used. A proper material depending on a heating system can be used also in thermal insulator 110, and, for example, heater 130 can have a coil shape and thermal insulator 110 can be made of cylindrical zirconia in the case of use of high-frequency induction heating. Here, thermal insulator 110 does not surround heater 130, but is disposed at a location which is in heater 130 and which surrounds crucible 140.

Crystal pulling shaft 160 is made of alumina, but the material is not limited thereto, and any of various materials can be used which have heat resistance to the temperature in heating chamber 120 and reaction resistance. Crystal pulling shaft 160 has the function of being rotated and rising and falling at a predetermined rate. Seed holder 161 to be formed at one end of crystal pulling shaft 160 is made of iridium, but the material is not limited thereto, and any of various materials can be used which have heat resistance at the melting temperature of a raw material and reaction resistance to seed crystal 162. Seed holder 161, which is connected to one end of crystal pulling shaft 160, can allow seed crystal 162 to be placed on the tip.

Seed crystal 162 to be held by seed holder 161 is made using a $ScAlMgO_4$ single crystal, and has a square prism shape, but the shape thereof is not limited thereto and any of various shapes such as a column and a prism having a notch can be used.

Melt 150 is obtained by heating and melting 4N (99.99%) of scandium oxide ($Sc_2O_3$), aluminum oxide ($Al_2O_3$), and magnesium oxide (MgO) as starting raw materials in crucible 140 made of iridium. In the present embodiment, the compounding ratio of scandium oxide ($Sc_2O_3$), aluminum oxide ($Al_2O_3$), and magnesium oxide (MgO) is as follows: $Sc_2O_3:Al_2O_3:MgO=27.5\%:26.5\%:46.0\%$ (atom %). A mixture of the raw materials is also sintered and then packed in crucible 140 in order to enhance the packing density of the raw materials and shorten the heating and melting time.

The method for producing a $ScAlMgO_4$ single crystal with crystal breeding apparatus 100 above will be described below. The method includes melting that melts raw materials in crucible 140, melt stabilization that stabilizes the Mg concentration in Mg concentration-keeping chamber 144, crystal breeding that brings seed crystal 162 into contact with melt 150 to pull the crystal, and cooling that cools the resulting crystal.

(Melting)

The melting is to heat and melt a raw material mixture packed in crucible 140. The atmospheres in heating chamber 120 and Mg concentration-keeping chamber 144 are each replaced with any desired gas atmosphere in advance, in heating and melting of the raw materials and breeding of a crystal. Heating chamber 120 and Mg concentration-keeping chamber 144 are evacuated to vacuum and then a predetermined gas is introduced to provide an ordinary pressure. Such a gas is supplied from a gas supply source (not illustrated) located out of a chamber, through gas introduction section 170 into heating chamber 120 and Mg concentration-keeping chamber 144.

The gas species to be mainly used is argon as an inert gas, but is not limited thereto. For example, a gas where 0.5% or less of oxygen relative to argon is mixed may also be used in order to actively suppress evaporation of magnesium (Mg) from melt 150 heated and molten. Alternatively, helium or the like may also be used as an inert gas instead of argon. Argon available at a relatively low cost is commercially desirable.

After replacement with the gas atmosphere, the raw materials are heated and molten. A current is applied to heater 130 to gradually increase a power over a time to such an extent that a high load is not applied to crucible 140, until the raw materials packed in crucible 140 are molten. The heating and melting time depends on the size of crucible 140, and is optimally from 30 hours to 60 hours in the case of crucible 140 having an outer diameter of 80 mm.

(Melt Stabilization)

After the raw materials are molten, various gas concentrations in Mg concentration-keeping chamber 144 and the temperature of the surface of melt 150 are measured with gas concentration measurement meter 180 and radiation thermometer 190, respectively, disposed in crystal breeding apparatus 100. The amount of a current to be applied to heater 130 and the amount of an inert gas to be introduced are adjusted so that the oxygen concentration and the carbon monoxide concentration in Mg concentration-keeping chamber 144, and the temperature of the surface of melt 150 are appropriate for crystal pulling.

(Crystal Breeding)

After the gas concentration in Mg concentration-keeping chamber 144 and the temperature of the surface of melt 150 are appropriately adjusted, crystal pulling shaft 160 is allowed to gradually fall down with being rotated at a constant speed, until seed crystal 162 is brought into contact with melt 150. After seed crystal 162 is brought into contact with melt 150, crystal pulling shaft 160 is allowed to rise at a constant speed (a crystal is pulled in the 0001 axial direction). After the start of the pulling, control to a desired crystal shape is made by automatic diameter control (ADC). In the present embodiment, an optimal speed of rotation of crystal pulling shaft 160 is in the range from 3 rpm to 10 rpm, and an optimal rate of rise of crystal pulling shaft 160 is in the range from 0.2 mm/h to 1.0 mm/h.

(Cooling)

After a crystal is pulled to a desired length, the crystal is separated from melt 150, and is cooled by a gradual decrease in power to be applied to heater 130, over a time to such an extent that a high load is not applied to crucible 140. In the case of use of crucible 140 having an outer diameter of 80 mm, the temperature is preferably dropped to a certain temperature over 60 hours or more.

(Adjustment of Amount of Magnesium in Crystal Breeding)

Next, a method for adjusting the amount of magnesium (Mg) to be incorporated into a $ScAlMgO_4$ single crystal in the crystal breeding is described in detail.

The reaction for evaporation of magnesium (Mg) contained in melt 150, into an inert gas, is represented by the following formula 1 and formula 2.

$$2MgO \Leftrightarrow 2Mg(G)\uparrow + O_2\uparrow \quad \text{(formula 1)}$$

$$MgO + CO \rightarrow Mg(G)\uparrow + CO_2\uparrow \quad \text{(formula 2)}$$

In formula 1 and formula 2, (G)↑ represents each gas.

Formula 1 is associated with the saturated steam pressure of magnesium oxide (MgO) as a raw material, and formula 2 corresponds to a formula for reaction of magnesium oxide (MgO) as a raw material with carbon monoxide gas and evaporation of magnesium.

As represented by formula 1, magnesium is evaporated in an inert gas, and thus magnesium (Mg) and oxygen are insufficient at the interface of melt 150. In the case where carbon monoxide is present in the surface of melt 150, the reactions represented by formula 1 and formula 2 occur in the surface of melt 150. Thus, particularly, magnesium (Mg) contained near the surface of melt 150 is likely to be insufficient. As a result, the magnesium (Mg) concentration in melt 150 is insufficient during formation of a $ScAlMgO_4$ crystal, resulting in a reduction in the amount of magnesium (Mg) to be incorporated into a layer where magnesium (Mg) and aluminum (Al) co-exist. As a result, an aluminum (Al)-rich $ScAlMgO_4$ single crystal not aligned in crystal orientation is obtained.

There has been conventionally proposed a method for forming a $ScAlMgO_4$ single crystal by mixing of oxygen in the range of 0.2% or more and less than 1.0% with an inert gas for the purpose of prevention of coloration, cracking, and inclusion in a $ScAlMgO_4$ single crystal. Only control of the oxygen concentration, however, cannot provide any sufficient suppression of evaporation of magnesium (Mg) from melt 150. It is necessary for providing a magnesium-rich $ScAlMgO_4$ single crystal to not only control the oxygen concentration, but also allow the magnesium (Mg) concentration in the surface of melt 150 to be saturated to thereby suppress evaporation of magnesium (Mg) from melt 150.

In the present embodiment, melt-warming heat-insulating material 143 is placed on crucible 140, and Mg concentration-keeping chamber 144 is formed. Melt-warming heat-insulating material 143 is placed so as not to make any gap with crucible 140. The gap between melt-warming heat-insulating material 143 and crystal pulling shaft 160 is set so that crystal pulling shaft 160 can be operated, resulting in suppression of inflow of any gas into Mg concentration-keeping chamber 144 and outflow of any gas from Mg concentration-keeping chamber 144 as much as possible. The gap between melt-warming heat-insulating material 143 and crystal pulling shaft 160 is preferably 2 mm or less.

The Mg gas generated from melt 150 remains in Mg concentration-keeping chamber 144 to be formed by disposing melt-warming heat-insulating material 143. Thus, the Mg concentration can be saturated.

Melt-warming heat-insulating material 143 is used to separate the atmosphere in heating chamber 120 and the atmosphere in Mg concentration-keeping chamber 144, thereby unlikely to cause carbon monoxide (CO) generated by a reaction of thermal insulator 110 disposed in heating chamber 120 and made of carbon, or of heater 130 with oxygen to penetrate into Mg concentration-keeping chamber 144. In addition, an inert gas to be introduced from gas introduction section 170 is unlikely to be caused to flow into Mg concentration-keeping chamber 144 and/or Mg is unlikely to be caused to flow out of Mg concentration-keeping chamber 144.

The Mg concentration in Mg concentration-keeping chamber 144 significantly depends on the oxygen ($O_2$) concentration and the carbon monoxide (CO) concentration in the system as represented by formula 1 and formula 2. Thus, it is important that not only the oxygen ($O_2$) concentration in Mg concentration-keeping chamber 144 be constant, but also inflow of a carbon (C) gas generated from heater 130 and thermal insulator 110 be suppressed and the carbon monoxide (CO) concentration in Mg concentration-keeping chamber 144 be decreased.

Specifically, the oxygen concentration and the carbon monoxide concentration are measured with gas concentration measurement meter 180 placed in Mg concentration-keeping chamber 144 in the melt stabilization. The flow rate of an inert gas and the oxygen ($O_2$) concentration in such an inert gas are varied depending on the oxygen concentration and the carbon monoxide concentration measured, resulting in adjustment of the concentrations of oxygen ($O_2$) and carbon monoxide (CO) in Mg concentration-keeping chamber 144. In the present embodiment, such adjustment is made so that the oxygen concentration in Mg concentration-keeping chamber 144 is from 0.05% to 0.5% and the carbon monoxide concentration is 21 ppm or less. Thus, the amount of magnesium (Mg) in Mg concentration-keeping chamber 144 is saturated, and magnesium (Mg) is sufficiently supplied to the surface of melt 150, corresponding to the crystal growth surface.

According to the method of the present embodiment, Mg is sufficiently incorporated into the atomic structure of a $ScAlMgO_4$ single crystal during crystal breeding. Thus, a high-quality $ScAlMgO_4$ single crystal stabilized in crystal orientation can be provided.

It is herein also important for sufficiently supplying Mg to the crystal growth interface to stabilize the variation in temperature at an interface of melt 150 to be in contact with seed crystal 162. In the present embodiment, the variation in temperature of melt 150 in 10 minutes is adjusted so as to fall within ±1.0° C. around the crystallization temperature in order to produce a magnesium-rich $ScAlMgO_4$ single crystal.

(Application of $ScAlMgO_4$ Single Crystal)

The $ScAlMgO_4$ single crystal can be used in production of, for example, a device having a device structure on the (0001) plane. The device structure is configured from a III group nitride semiconductor typified by GaN. The device structure is formed by breeding of gallium nitride (GaN) according to a so-called vapor deposition method such as a hydride vapor phase epitaxy (HVPE) method or a metal organic chemical vapor deposition (MOCVD) method.

The type of the device structure is not particularly limited, and can be, for example, a semiconductor laser diode or a light-emitting diode.

EXAMPLES

Hereinafter, the present invention will be more specifically described with reference to Examples. The scope of the present invention is not construed to be limited to such Examples.

Example 1-1

(Preparation)

A vessel prepared in advance was charged with 4N (99.99%) of scandium oxide ($Sc_2O_3$), aluminum oxide ($Al_2O_3$), and magnesium oxide (MgO) at a compounding ratio of $Sc_2O_3:Al_2O_3:MgO=27.5\%:26.5\%:46.0\%$ (atom %), and such materials were mixed. After the mixture was sintered, the resulting sintered body was packed in crucible 140. Crucible 140 had an outer diameter of 80 mm and was made of iridium.

(Melting)

Crucible 140 was heated at a constant rate of temperature rise over 30 hours so that crucible 140 was not deformed by thermal loading, thereby providing desired melt 150.

(Melt Stabilization)

The oxygen concentration and the carbon monoxide concentration in Mg concentration-keeping chamber 144 were measured with gas concentration measurement meter 180 in order to start crystal breeding. The flow rate of any gas to be introduced from gas introduction section 170, or the like was adjusted so that the oxygen concentration was 0.5% and the carbon monoxide concentration was 21 ppm. The temperature of the surface of melt 150 was measured with radiation thermometer 190 in order to control the temperature of the surface of melt 150. The temperature of the surface of melt 150 was adjusted so that the variation in temperature in 10 minutes fell within ±1.0 (° C.) around the temperature which enabled a single crystal to be bred.

(Crystal Breeding)

Crystal pulling shaft 160 was allowed to fall down to thereby bring seed crystal 162 into contact with melt 150. Thereafter, pulling was made at a speed of 0.7 mm/h with crystal pulling shaft 160 being rotated at a speed of rotation of 5 rpm. After a crystal having a desired shape was obtained, the crystal was separated from the melt.

(Cooling)

Figure 2:
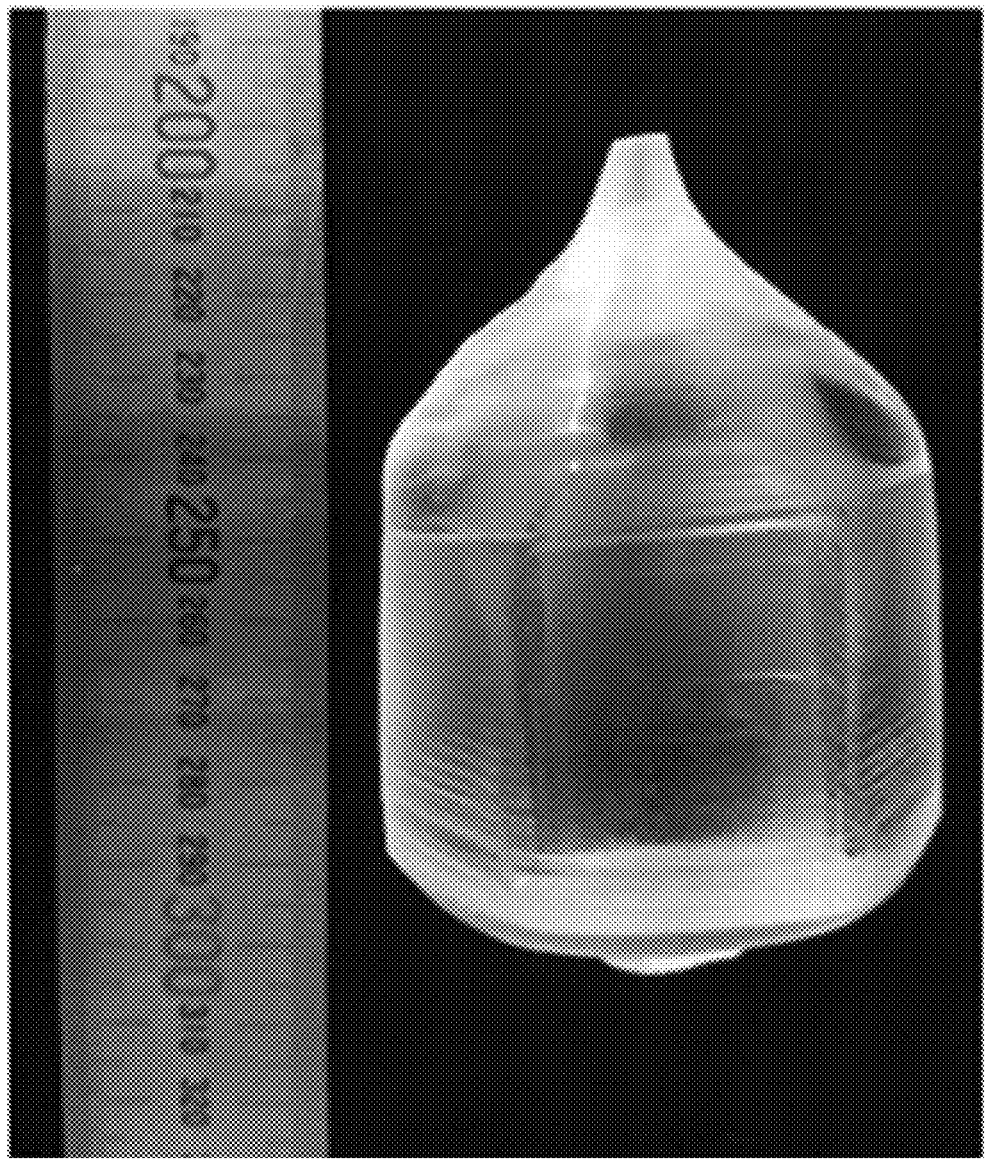
FIG. 2 is a photograph of an ingot of a $ScAlMgO_4$ single crystal produced in Examples.

The resulting $ScAlMgO_4$ single crystal was gradually cooled over 60 hours so as to be prevented from being thermally cracked. As a result, a $ScAlMgO_4$ single crystal body having a diameter of 60 mm and a length of a barrel section of 40 mm was obtained as illustrated in FIG. 2.

(Evaluation)

The resulting $ScAlMgO_4$ single crystal was analyzed in detail with respect to the quality thereof.

Figure 3A:
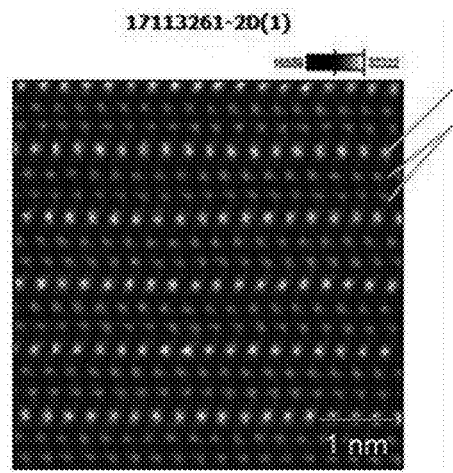
FIG. 3A illustrates the atomic order of a $ScAlMgO_4$ single crystal produced in the Examples, and FIG. 3B to FIG. 3E each illustrate the atomic structure and the atom density distribution of the $ScAlMgO_4$ single crystal.
Figure 3B:
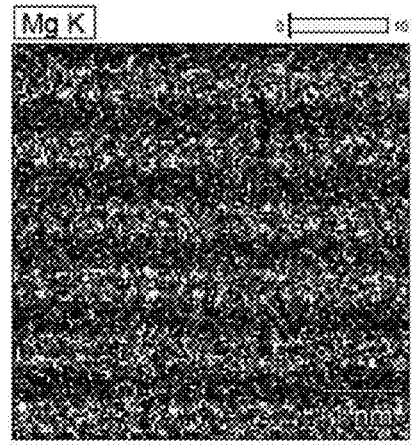
Figure 3C:
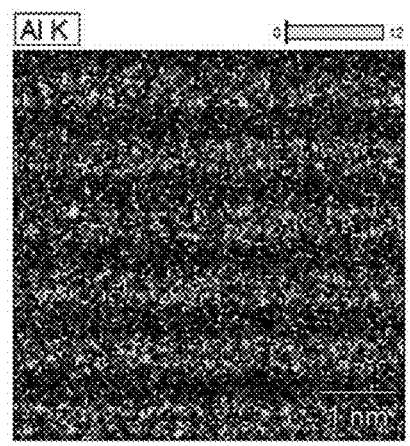
Figure 3D:
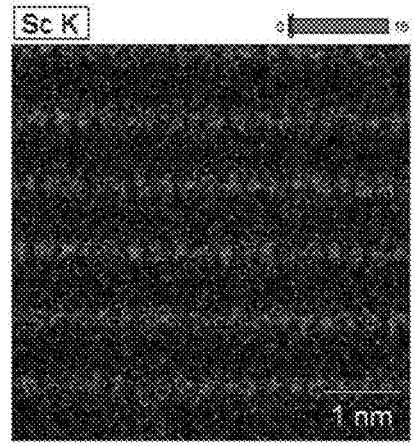
Figure 3E:
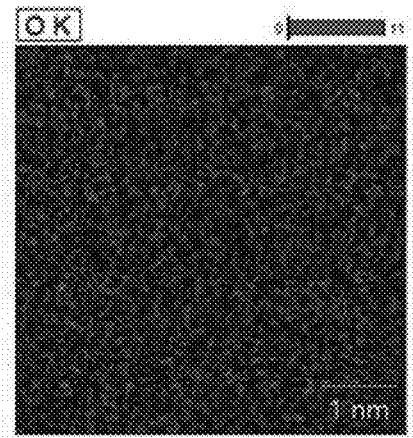

FIG. 3A is a photograph illustrating the atomic order of scandium (Sc), aluminum (Al), and magnesium (Mg) in the resulting $ScAlMgO_4$ single crystal, observed in the m-plane direction by a transmission electron microscope (TEM) at an accelerating voltage of 200 KV with an apparatus JEM-ARM200F (manufactured by JEOL Ltd.). FIG. 3B to FIG. 3E illustrate the measurement results according to energy dispersive X-ray analysis (EDX). FIG. 3B illustrates the atomic distribution of magnesium (Mg) (light-colored region: Mg), FIG. 3C illustrates the atomic distribution of aluminum (Al) (light-colored region: Al), FIG. 3D illustrates the atomic distribution of scandium (Sc) (light-colored region: Sc), and FIG. 3E illustrates the atomic distribution of oxygen (O) (light-colored region: O).

It was found from FIG. 3A to FIG. 3E that three layers including a scandium (Sc) layer, a layer with co-existence of magnesium (Mg)/aluminum (Al), and a layer with co-existence of magnesium (Mg)/aluminum (Al) were periodically aligned as one cycle as in a $ScAlMgO_4$ single crystal model commonly proposed. It was also found that the $ScAlMgO_4$ single crystal produced in the Example above was a high-quality single crystal aligned in crystal orientation.

Magnesium (Mg) and aluminum (Al) are close to each other in terms of atomic physical properties, and there cannot be identified any detail alignment at the level of the number of atoms according to TEM analysis and/or EDX analysis described above. The concentrations of magnesium (Mg) and aluminum (Al) contained in the $ScAlMgO_4$ single crystal were here analyzed by the ICP-AES method.

Table 1 represents the results of ICP analysis of the $ScAlMgO_4$ single crystal. As represented in Table 1, the ratio of scandium (Sc) and oxygen (O) was the same as the stoichiometric ratio. On the contrary, the atomic percentage ratio of magnesium (Mg) to aluminum (Al), Mg/Al (atom %/atom %), was 1.09, and it was thus found that a magnesium-rich $ScAlMgO_4$ single crystal was obtained.

TABLE 1

| Ratio (atom %) of constituent atoms in $ScAlMgO_4$ single crystal | | | | Mg/Al ratio |
|---|---|---|---|---|
| Sc | Al | Mg | O | (atom %/atom %) |
| 14.2 | 13.6 | 14.8 | 57.4 | 1.09 |

Figure 4A:
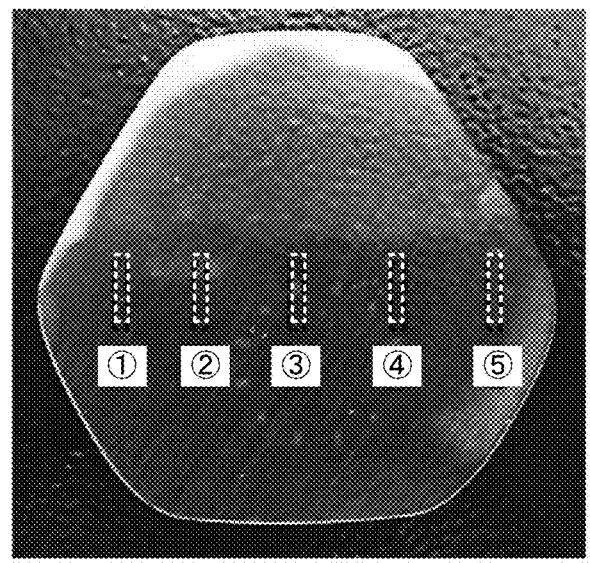
FIG. 4A is a photograph illustrating measurement points on a $ScAlMgO_4$ single crystal substrate produced in the Examples.
Figure 4B:
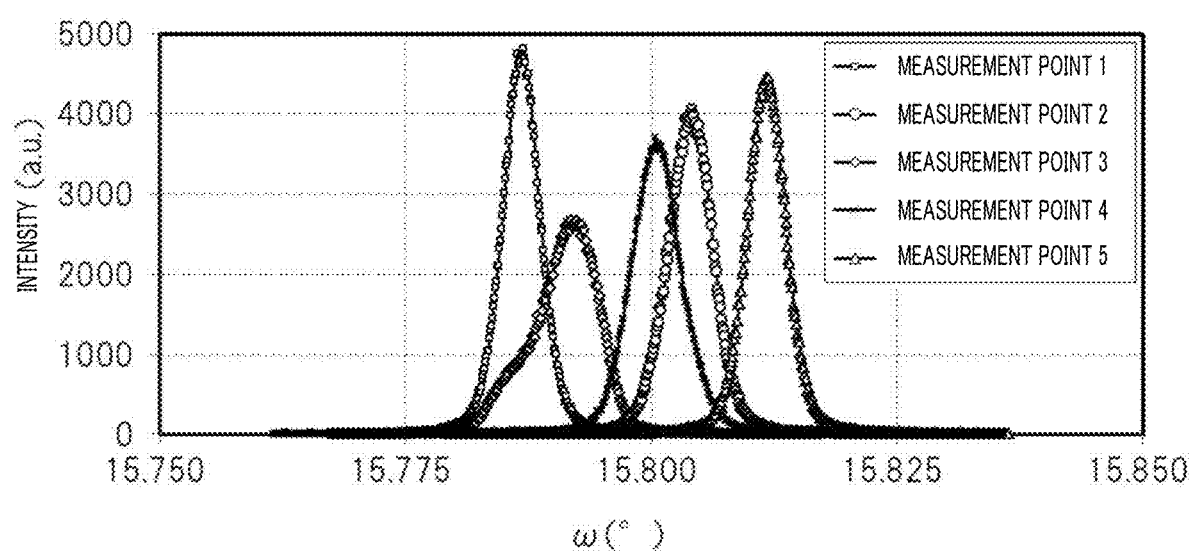
FIG. 4B is a characteristic diagram of an X-ray rocking curve (XRC) at each of the measurement points.

Subsequently, the $ScAlMgO_4$ single crystal produced in Example 1-1 was sliced to provide a crystal substrate. FIG. 4A is a photograph of the crystal substrate. FIG. 4B is a characteristic diagram in measurement of the X-ray rocking curve (XRC) (ω scanning at 2θω) at each of measurement points including measurement point 1 to measurement point 5 on the crystal substrate illustrated in FIG. 4A.

Measurement was performed at 5 points including the center (measurement point 3) of the substrate and points (4 points in total) obtained by trisection of the distance from the center to the outer circumference of the substrate, as illustrated in FIG. 4A. The units (a.u) of the intensity described in FIG. 4B are expressed as arbitrary units, and such arbitrary units are for comparison of each data.

The characteristic diagram of the X-ray rocking curve illustrates the axial fluctuation of the c-axis of the $ScAlMgO_4$ single crystal. As illustrated in FIG. 4B, a single peak waveform is observed at each of the measurement points, indicating that the crystal orientation is aligned in the substrate.

Table 2 represents the full widths at half maximum (sec) at measurement point 1 to measurement point 5, obtained by the characteristic diagram of the X-ray rocking curve (XRC) in FIG. 4B. As represented in Table 2, the minimum value and maximal value of the full widths at half maximum (sec) at measurement points 1 to 5 were 15.6 (sec) and 19.8 (sec), respectively. As clear from the results, the $ScAlMgO_4$ single crystal in the Example had a narrow full width at half maximum and was a high-quality crystal as compared with a $ScAlMgO_4$ single crystal formed by a conventional method.

TABLE 2

| Measurement point 1 | Measurement point 2 | Measurement point 3 | Measurement point 4 | Measurement point 5 |
|---|---|---|---|---|
| 15.6 | 18.6 | 19.5 | 19.8 | 16.5 |

Comparative Examples

As described in the above embodiment, the change in Mg concentration in a space above melt 150 allows the atomic percentage ratio Mg/Al (atom %/atom %) of magnesium and aluminum to fall within a desired range. In order to examine this, each $ScAlMgO_4$ single crystal was produced with the CO concentration and the $O_2$ concentration above melt 150 being varied. The conditions are represented in Table 3. Each gas concentration was measured with gas concentration measurement meter 180.

Herein, Example 1-1 was the same as Example 1-1 described above. In Example 1-2 to Example 1-10, each $ScAlMgO_4$ single crystal was produced under the same conditions as in Example 1-1 except that the respective oxygen concentrations in the melt stabilization and the crystal breeding were changed. The oxygen ($O_2$) concentration was decreased in decrements of 0.05% from that in Example 1-1, and thus the correlation between the concentration of magnesium (Mg) to be incorporated into the $ScAlMgO_4$ single crystal and the concentration of oxygen ($O_2$) was confirmed.

On the other hand, in Comparative Examples, each $ScAlMgO_4$ single crystal was produced by the same method as in Example 1-1 except that a 1-mm gap was provided between melt-warming heat-insulating material 143 and crucible 140 and the CO concentration and the $O_2$ concentration were changed. Such a gap was provided between melt-warming heat-insulating material 143 and crucible 140, thereby causing an inert gas flowing in from gas introduction section 170 to flow in Mg concentration-keeping chamber 144 through a gap between melt-warming heat-insulating material 143 and crystal pulling shaft 160. Such an inert gas passed through the surface of melt 150, and thereafter flowed out towards heating chamber 120 through the gap between melt-warming heat-insulating material 143 and crucible 140. Thus, the oxygen concentration and the carbon monoxide concentration in Comparative Example 2-8 were 0.5% and 21 ppm, respectively, and such values were the same as those in Example 1-1, but the inert gas caused a magnesium (Mg) gas evaporated from the surface of melt 150 to be withdrawn towards heating chamber 120. Thus, the magnesium (Mg) concentration in Mg concentration-keeping chamber 144 was not saturated. In other words, such a non-saturated state caused magnesium (Mg) to be insufficient in the surface of melt 150.

All conditions in Comparative Example 2-1 to Comparative Example 2-8 were fixed at an oxygen ($O_2$) concentration of 0.5% which was the same as in Example 1-1 where magnesium (Mg) was rich. The carbon monoxide (CO) concentration was changed with being increased, and the correlation with magnesium (Mg) to be incorporated into the $ScAlMgO_4$ single crystal was obtained. The carbon monoxide (CO) concentration was changed from 0 ppm to 21 ppm in increments of 3 ppm.

TABLE 3

|  |  | CO concentration (ppm) | $O_2$ concentration (%) |
|---|---|---|---|
| Examples | Example 1-1 | 21 | 0.50 |
|  | Example 1-2 | 21 | 0.45 |
|  | Example 1-3 | 21 | 0.40 |
|  | Example 1-4 | 21 | 0.35 |
|  | Example 1-5 | 21 | 0.30 |
|  | Example 1-6 | 21 | 0.25 |
|  | Example 1-7 | 21 | 0.20 |
|  | Example 1-8 | 21 | 0.15 |
|  | Example 1-9 | 21 | 0.10 |
|  | Example 1-10 | 21 | 0.05 |
| Comparative Examples | Comparative Example 2-1 | 0 | 0.50 |
|  | Comparative Example 2-2 | 3 | 0.50 |
|  | Comparative Example 2-3 | 6 | 0.50 |
|  | Comparative Example 2-4 | 9 | 0.50 |
|  | Comparative Example 2-5 | 12 | 0.50 |
|  | Comparative Example 2-6 | 15 | 0.50 |
|  | Comparative Example 2-7 | 18 | 0.50 |
|  | Comparative Example 2-8 | 21 | 0.50 |

The $ScAlMgO_4$ single crystals produced under the respective conditions in Example 1-2 to Example 1-10, and Comparative Example 2-1 to Comparative Example 2-8 were evaluated with respect to characteristics thereof. The results are represented in Table 4.

TABLE 4

|  |  | Mg/Al (atom %/atom %) | Full width at half maximum (sec) of $ScAlMgO_4$ | Full width at half maximum (sec) of GaN | Dislocation density ($cm^{-2}$) of GaN |
|---|---|---|---|---|---|
| Examples | Example 1-1 | 1.09 | 19.8 | 299 | 8.0E+7 |
|  | Example 1-2 | 1.08 | 16.0 | 292 | 4.6E+7 |
|  | Example 1-3 | 1.08 | 15.6 | 283 | 5.0E+7 |
|  | Example 1-4 | 1.08 | 15.5 | 284 | 4.4E+7 |
|  | Example 1-5 | 1.07 | 15.0 | 281 | 5.0E+7 |
|  | Example 1-6 | 1.06 | 13.0 | 272 | 4.4E+7 |
|  | Example 1-7 | 1.04 | 13.5 | 278 | 4.6E+7 |
|  | Example 1-8 | 1.03 | 15.0 | 289 | 4.9E+7 |
|  | Example 1-9 | 1.02 | 16.2 | 291 | 6.2E+7 |
|  | Example 1-10 | 1.01 | 18.8 | 294 | 6.0E+7 |
| Comparative Examples | Comparative Example 2-1 | 0.99 | 22.7 | 317 | 2.8E+8 |
|  | Comparative Example 2-2 | 0.99 | 27.6 | 326 | 3.0E+8 |
|  | Comparative Example 2-3 | 0.98 | 25.9 | 340 | 3.2E+8 |
|  | Comparative Example 2-4 | 0.98 | 33.1 | 342 | 3.3E+8 |
|  | Comparative Example 2-5 | 0.98 | 37.2 | 363 | 4.0E+8 |
|  | Comparative Example 2-6 | 0.97 | 38.9 | 368 | 4.6E+8 |

TABLE 4-continued

|  | Mg/Al (atom %/atom %) | Full width at half maximum (sec) of ScAlMgO$_4$ | Full width at half maximum (sec) of GaN | Dislocation density (cm$^{-2}$) of GaN |
|---|---|---|---|---|
| Comparative Example 2-7 | 0.97 | 38.0 | 349 | 3.5E+8 |
| Comparative Example 2-8 | 0.96 | 46.4 | 375 | 4.2E+8 |

In Table 4 above, the Mg/Al (atom %/atom %) corresponded to the value obtained by analyzing the respective concentrations of magnesium (Mg) and aluminum (Al) in each of the resulting ScAlMgO$_4$ single crystals, according to the ICP-AES method, and identifying the ratio Mg/Al (atom %/atom %).

The full width at half maximum (sec) of ScAlMgO$_4$ corresponded to the measurement result of the full width at half maximum of the X-ray rocking curve (XRC) on the (0001) plane of a crystal substrate obtained from each of the ScAlMgO$_4$ single crystals. The measurement method of the full width at half maximum (sec) was the same as the measurement method in Example 1-1 described above.

The full width at half maximum (sec) of GaN corresponded to the measurement result of the full width at half maximum of the X-ray rocking curve (XRC) of a GaN film at any measurement point where the full width at half maximum of ScAlMgO$_4$ was maximum, the GaN film being formed on the (0001) plane of a crystal substrate obtained by processing each of the ScAlMgO$_4$ single crystals into a wafer, according to the MOCVD method.

The dislocation density (cm$^{-2}$) of GaN corresponded to the measurement result of the dislocation defect density (cm$^{-2}$) of a GaN film at any measurement point where the full width at half maximum of ScAlMgO$_4$ was maximum, the GaN film being formed on the (0001) plane of a crystal substrate obtained by processing each of the ScAlMgO$_4$ single crystals into a wafer, according to the MOCVD method.

Figure 5:
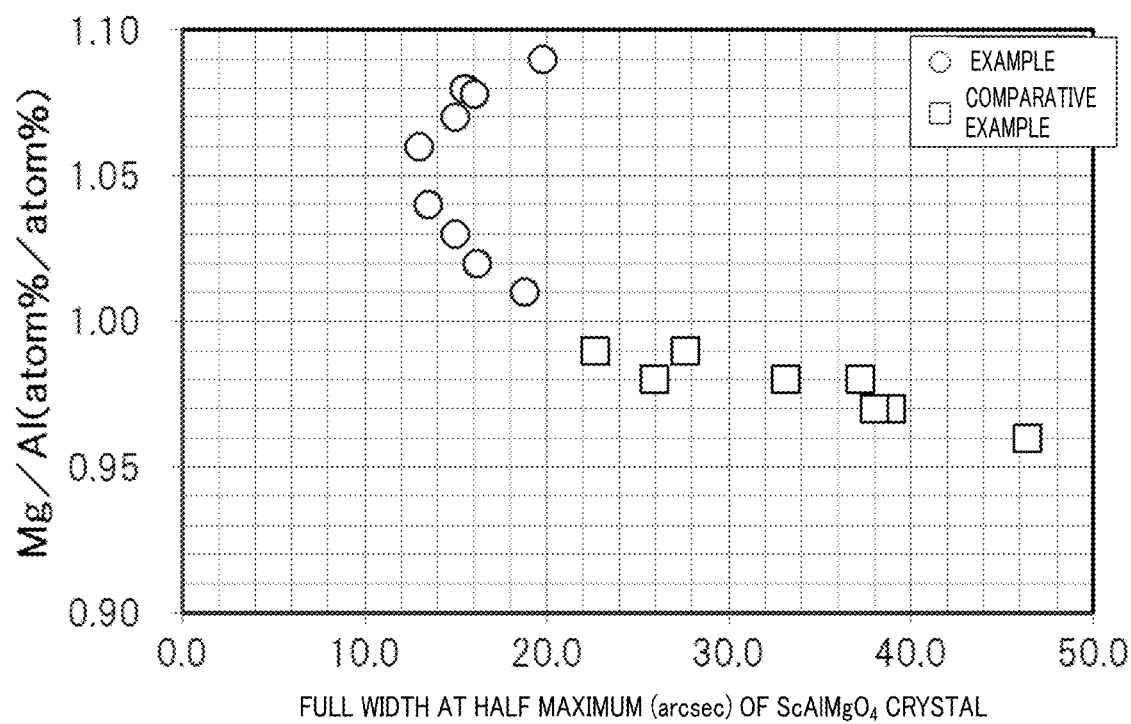
FIG. 5 is a characteristic diagram illustrating the correlation between the full width at half maximum (sec) of each $ScAlMgO_4$ single crystal substrate produced in the Examples and Comparative Examples and the atomic percentage ratio, Mg/Al (atom %/atom %), of atoms constituting the substrate.

FIG. 5 is a correlation diagram between the full width at half maximum (sec) and Mg/Al (atom %/atom %) of each ScAlMgO$_4$ single crystal. As illustrated in FIG. 5, it was found that the oxygen concentration was changed in the range from 0.05% to 0.5% in the Examples and, as a result, a ScAlMgO$_4$ single crystal having a narrow full width at half maximum was obtained at the Mg/Al (atom %/atom %) ranging from 1.01 as the minimum value to 1.09 as the maximal value. That is, it can be said from the correlation with the full width at half maximum that the atomic percentage ratio of Mg to Al, Mg/Al (atom %/atom %), obtained by the ICP-AES method, is desirably more than 1 and less than 1.1.

As clear from Table 3 and Table 4, a higher oxygen (O$_2$) concentration allows a crystal richer in magnesium (Mg) to be obtained. The full width at half maximum of each of magnesium (Mg)-rich ScAlMgO$_4$ single crystals fell within the range from 13 seconds to 19.8 seconds, and was 20 seconds or less.

On the other hand, the value of Mg/Al (atom %/atom %) was less than 1.0 all under conditions considered to easily suppress evaporation of magnesium (Mg), where the oxygen (O$_2$) concentration was 0.5% and the carbon monoxide (CO) concentration was 0 ppm as in Comparative Example 2-1, under conditions similar to those in Example 1-1, for example, the conditions in Comparative Example 2-8, and also under any intermediate conditions between such conditions (those in Comparative Example 2-2 to Comparative Example 2-7).

As clear from the results, evaporation of a certain amount of magnesium (Mg) from melt 150 resulted in a decrease in incorporation of magnesium (Mg) into the ScAlMgO$_4$ single crystal in Comparative Example 2-1 to Comparative Example 2-8. The full width at half maximum of the ScAlMgO$_4$ single crystal in each of the Comparative Examples was from 22.7 seconds to 46.4 seconds, which was increased as compared with those of the Examples.

Figure 6:
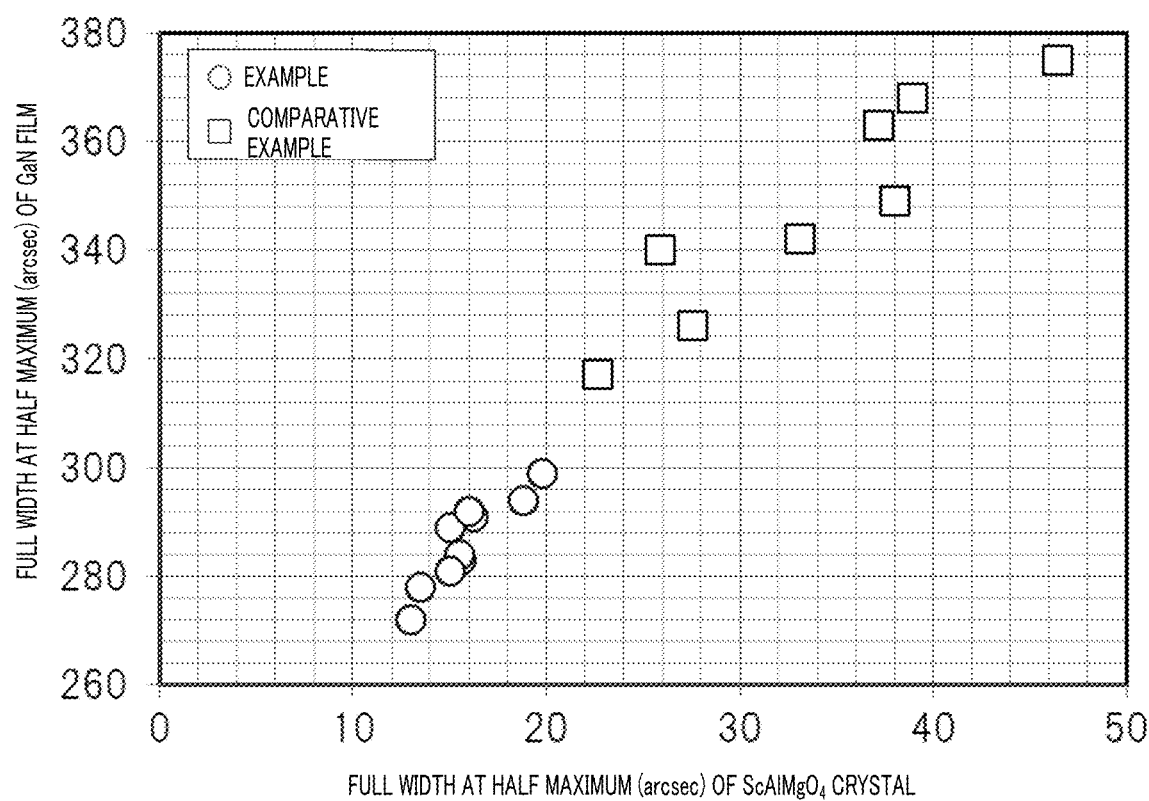
FIG. 6 is a characteristic diagram illustrating the correlation between the full width at half maximum (sec) of each $ScAlMgO_4$ single crystal substrate produced in Example and Comparative Example and the full width at half maximum (sec) of a GaN film formed on the substrate.

FIG. 6 is a characteristic diagram illustrating the correlation between the full width at half maximum of each of the crystal substrates (ScAlMgO$_4$ single crystals) represented in Table 4 and the full width at half maximum of a GaN film formed on the crystal substrate. While the GaN film had a full width at half maximum ranging from 272 seconds to 299 seconds in the Examples, the GaN film had a full width at half maximum ranging from 317 seconds to 368 seconds in the Comparative Examples, and the values in the Comparative Examples were higher than those in the Examples. In other words, it can be seen that disorder of the crystal orientation of the ScAlMgO$_4$ single crystal has any effect on disorder of the crystal orientation of the GaN film to be formed on the crystal substrate.

Accordingly, it can be said that the amount of magnesium (Mg) to be incorporated into the ScAlMgO$_4$ single crystal can be enriched to thereby uniform the orientation of the ScAlMgO$_4$ single crystal, thereby allowing a high-quality ScAlMgO$_4$ single crystal to be provided. Furthermore, it can be said that the GaN film can be formed on such a high-quality ScAlMgO$_4$ single crystal, thereby providing a high-quality GaN film.

As illustrated in FIG. 5, in particular, the full width at half maximum (sec) of ScAlMgO$_4$ is rapidly improved at the Mg/Al (atom %/atom %) ranging from 1.03 to 1.07, and the full width at half maximum (sec) is 15 seconds or less. As illustrated in FIG. 6, the full width at half maximum of the GaN film is also rapidly improved from 290 seconds to 280 seconds at a full width at half maximum (sec) of ScAlMgO$_4$ of 15 seconds. Accordingly, the Mg/Al (atom %/atom %) more preferably falls within the range from 1.03 to 1.07.

Figure 7:
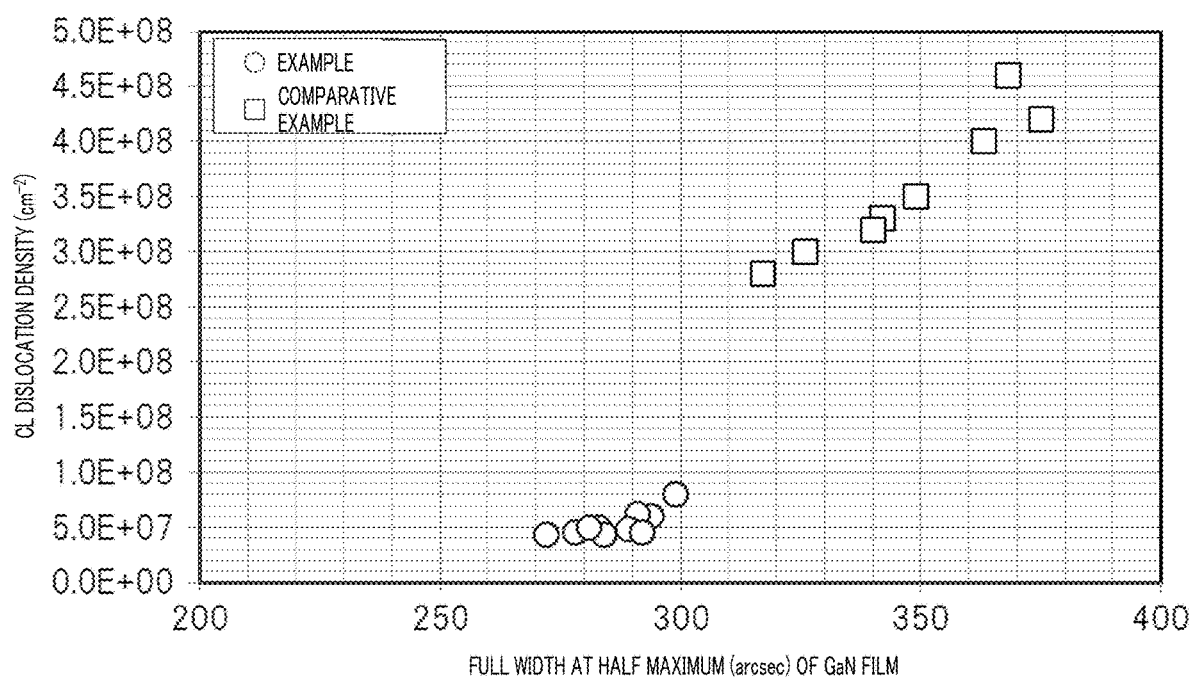
FIG. 7 is a characteristic diagram illustrating the correlation between the full width at half maximum (sec) of a GaN film formed on each $ScAlMgO_4$ single crystal substrate produced in the Examples and the Comparative Examples and the dislocation density of the GaN film.

FIG. 7 is a characteristic diagram illustrating a relationship between the full width at half maximum of a GaN film formed on a crystal substrate extracted from each of the ScAlMgO$_4$ single crystals formed in the Examples and the Comparative Examples, according to the MOCVD method, and the dislocation density of the GaN film.

While the dislocation density of the GaN film formed on the crystal substrate in the Examples fell within the range from $4.4 \times 10^7$ (cm$^{-2}$) to $8.0 \times 10^7$ (cm$^{-2}$), the dislocation density in the Comparative Examples fell within the range from $2.8 \times 10^8$ (cm$^{-2}$) to $4.6 \times 10^8$ (cm$^{-2}$). In other words, while the dislocation density in the Examples was on the order of $10^7$ (cm$^{-2}$), the dislocation density in the Comparative Examples was on the order of $10^8$ (cm$^{-2}$), and a distinct difference in dislocation density was confirmed.

Figure 8A:
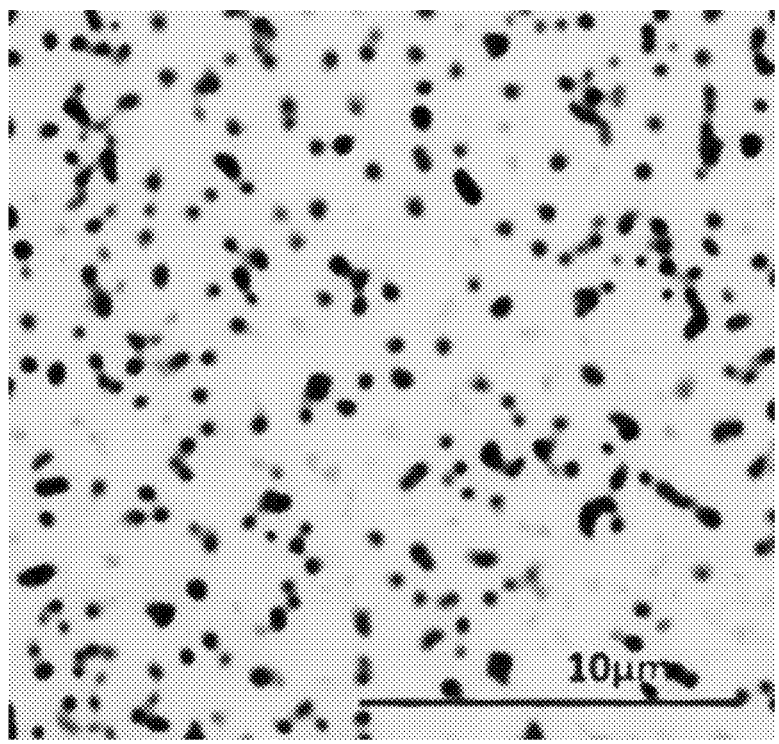
FIG. 8A is a measurement diagram of the dislocation distribution of a GaN film formed on a $ScAlMgO_4$ single crystal substrate produced in Example 1-3.
Figure 8B:
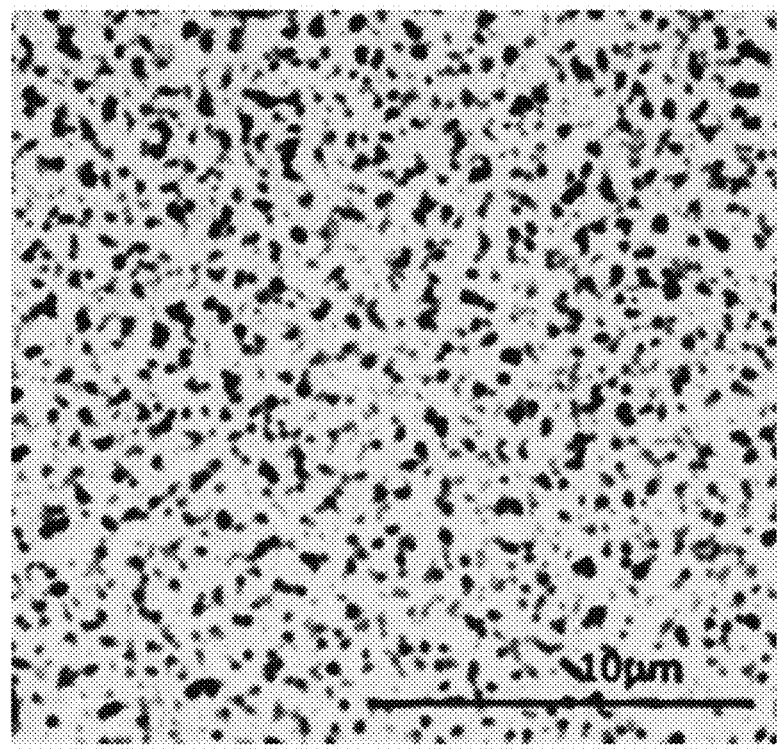
FIG. 8B is a measurement diagram of the dislocation distribution of a GaN film formed on a substrate obtained from a $ScAlMgO_4$ single crystal produced in Comparative Example 2-2.

FIG. 8A illustrates the dislocation density of a GaN film obtained in Example 1-3 according to the cathode luminescence method (CL method), and FIG. 8B illustrates the dislocation density of a GaN film obtained in Comparative Example 2-2 according to the cathode luminescence method (CL method). From comparison of them, the dislocation in the Examples was clearly significantly decreased, although the dislocation density in FIG. 8A was ⅙ of that in FIG. 8B. In other words, the amount of magnesium (Mg) to be incorporated into the ScAlMgO$_4$ single crystal can be enriched to thereby allow a GaN film low in dislocation density to be provided.

Next, a light-emitting diode (LED) was stacked on the crystal substrate extracted from the ScAlMgO$_4$ single crystal in Example 1-3, and a light-emitting diode (LED) having the same structure was stacked on the crystal substrate in Comparative Example 2-2, and a current was applied to the light-emitting diodes to measure respective internal quantum efficiencies.

Figure 9:
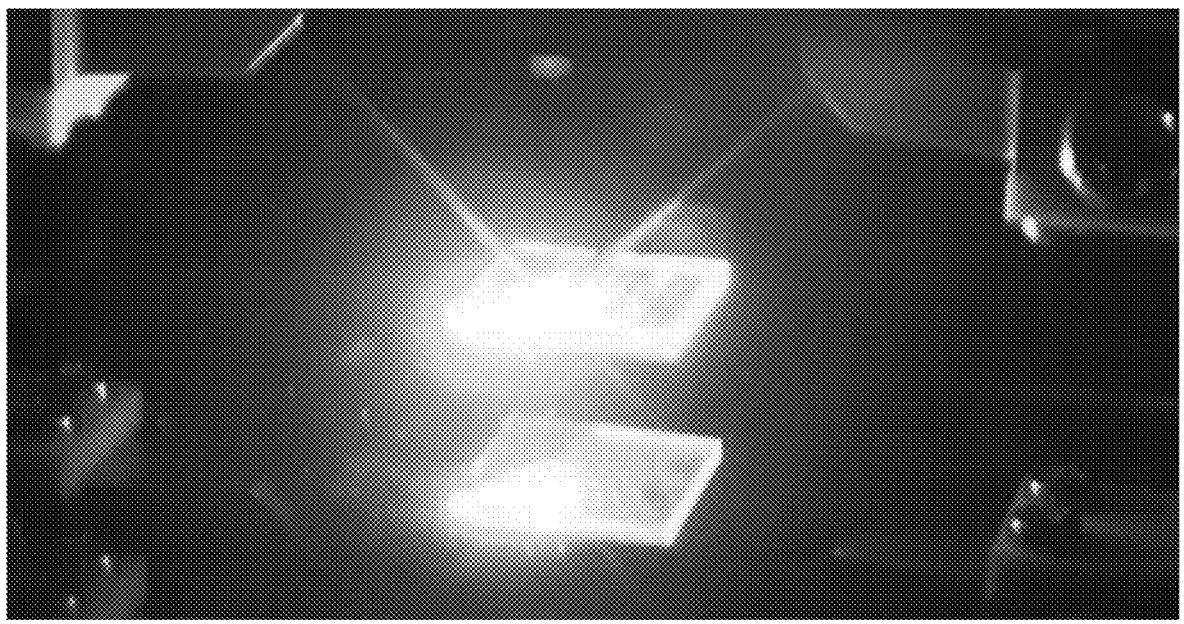
FIG. 9 is a photograph of a light-emitting diode produced on a $ScAlMgO_4$ single crystal substrate in Example 1-3.
Figure 10:
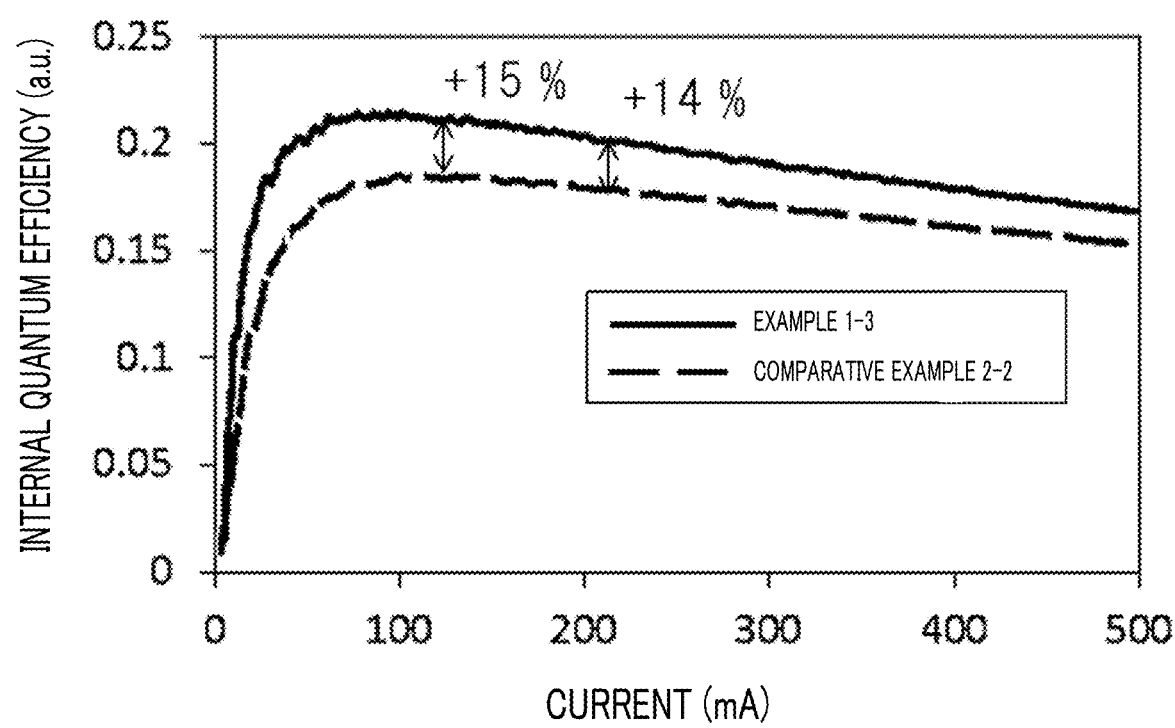
FIG. 10 is a characteristic diagram of the internal quantum efficiencies of respective light-emitting diodes produced on a $ScAlMgO_4$ single crystal substrate produced in Example 1-3 and a $ScAlMgO_4$ single crystal substrate produced in Comparative Example 2-2.

FIG. 9 illustrates a light-emitting diode (LED) produced in Example 1-3. FIG. 10 is a characteristic diagram of the internal quantum efficiency obtained by each of the light-emitting diodes (LED) produced in Example 1-3 and Comparative Example 2-2. The units (a.u) of the respective internal quantum efficiencies were expressed as arbitrary units, and such arbitrary units were for comparison of each data.

As clear from FIG. 10, the light-emitting diode (LED) using the crystal substrate in Example 1-3 was favorable in internal quantum efficiency by about 14% to 15% as compared with the light-emitting diode using the crystal substrate in Comparative Example 2-2. It was indicated that the current applied was more efficiently converted to light by the light-emitting diode in Example 1-3. The reason was because few dislocation defects of the GaN film allowed the loss due to a current leaked to be decreased. It can be seen that a GaN film low in dislocation density is highly due to a high-quality GaN film aligned in crystal orientation and a high-quality ScAlMgO$_4$ single crystal aligned in crystal orientation contributes to an enhancement in performance of a light-emitting diode (LED). Such a tendency is also represented by the difference in dislocation density. While the maximal value of the dislocation density in the Examples was $8.0 \times 10^7$ (cm$^{-2}$), the minimum value of the dislocation density in the Comparative Examples was $2.8 \times 10^8$ (cm$^{-2}$), and it was thus found from such results that a light-emitting diode (LED) more excellent in internal quantum efficiency was obtained in the Examples.

As described above, a light-emitting diode produced on a crystal substrate obtained from a high-quality ScAlMgO$_4$ single crystal rich in magnesium (Mg) and aligned in crystal orientation can be significantly improved in performance. That is, a device structure can be provided on the (0001) plane of the ScAlMgO$_4$ single crystal of the present embodiment, thereby realizing a high-performance device (for example, semiconductor laser diode and light-emitting diode).

INDUSTRIAL APPLICABILITY

The present disclosure can be utilized for a device such as a light-emitting diode (LED).

REFERENCE SIGNS LIST

100 Crystal breeding apparatus
110 Thermal insulator GaN film
120 Heating chamber
130 Heater
140 Crucible
141 Crucible support shaft
142 Refractory
143 Melt-warming heat-insulating material
144 Mg concentration-keeping chamber
150 Melt
160 Crystal pulling shaft
161 Seed holder
162 Seed crystal
170 Gas introduction section
180 Gas concentration measurement meter
190 Radiation thermometer

The invention claimed is:

1. A ScAlMgO$_4$ single crystal, comprising Sc, Al, Mg, and O as constituent atoms, wherein
an atomic percentage ratio of Mg to Al in the constituent atoms, Mg/Al (atom %/atom %), as measured by an inductively coupled plasma emission spectrometric method, is more than 1 and less than 1.1.

2. The ScAlMgO$_4$ single crystal according to claim 1, wherein the Mg/Al (atom %/atom %) as measured by the inductively coupled plasma emission spectrometric method is 1.03 or more and 1.07 or less.

3. A device comprising the ScAlMgO$_4$ single crystal according to claim 1, and a device structure disposed on a (0001) plane of the ScAlMgO$_4$ single crystal.

4. The device according to claim 3, wherein the device structure is a semiconductor laser diode or a light-emitting diode.

5. A device comprising the ScAlMgO$_4$ single crystal according to claim 2, and a device structure disposed on a (0001) plane of the ScAlMgO$_4$ single crystal.

6. The device according to claim 5, wherein the device structure is a semiconductor laser diode or a light-emitting diode.

* * * * *